United States Patent Office 3,515,583
Patented June 2, 1970

3,515,583
METHOD FOR MANUFACTURING SEMICONDUCTOR DEVICES

Morio Inoue and Gota Kano, Suita-shi, and Jinichi Matsuno and Shigetoshi Takayanagi, Kyoto, Japan, assignors to Matsushita Electronics Corporation, Osaka, Japan, a corporation of Japan
No Drawing. Filed Mar. 20, 1967, Ser. No. 624,125
Claims priority, application Japan, Mar. 29, 1966, 41/10,208
Int. Cl. H01d 7/00, 7/20
U.S. Cl. 117—200 1 Claim

ABSTRACT OF THE DISCLOSURE

A method for manufacturing a semiconductor device by first depositing, by hydrogen reduction of a halide of molybdenum or tungsten, a mixture of molybdenum or tungsten and lower halides of such metal onto a semiconductor substrate consisting of silicon, germanium or gallium arsenide heated at 400° C. to 500° C., and then subjecting the composite body of substrate and deposited film to heat-treatment in a hydrogen atmosphere, whereby a semiconductor device having a good Schottky barrier between semiconductor and film can be obtained.

The present invention relates to a method for manufacturing semiconductor devices of the surface barrier type, utilizing the rectifying action of the so-called Schottky barrier which is formed by the contact between a semiconductor and a metal.

Semiconductor devices of the surface barrier type such as diode have been manufactured by bringing an appropriate metal into contact with an appropriate semiconductor, utilizing either the point contact technique, the electroplating technique, vacuum deposition technique, the electron beam evaporation technique or the chemical deposition technique. However, the formation of an ideal Schottky barrier requires that no other substances be present at the interface of the semiconductor and the metal and also that the metal be held on the face of the semiconductor in tight contact relation. Among known combinations between semiconductors and metals, however, there are few that can satisfy these requirements, and thus it has been difficult to form satisfactory Schottky barriers. Accordingly, among the semiconductor-metal combinations of the prior art, those which have been known as being of practical use are represented by a composite body of gold and a substrate consisting of germanium, silicon or gallium arsenide, which is produced by contacting said substrate with gold by vacuum deposition or by point contacting, and also a composite body of tungsten or molybdenum and such substrate which is formed by contacting the substrate with one of these metals, utilizing the chemical deposition or the point contact technique.

Among these conventional semiconductor devices, those formed by the chemical deposition of tungsten or molybdenum on said substrate having a metal-semiconductor eutectic temperature which is higher than that of the devices where gold is used, and therefore, Schottky barriers which are stable at high temperature can be produced in such devices which use tungsten or molybdenum. Besides, the barriers formed in the latter devices can stand the treatments and processing which use a high temperature such as 500° C., and for this reason, they are most suitable for the manufacture of diodes. Furthermore, a device using such a metal as tungsten or molybdenum which has a work function smaller than gold shows a barrier level which is lower than that of a device using gold when the device is applied to a diode. Therefore, a diode having a large forward current density can be made with a semiconductor device using tungsten or molybdenum.

On the other hand, however, it has been quite difficult to deposit a molybdenum or tungsten film on a semiconductor substrate such as silicon and to thereby produce a barrier at their interface. It is for this reason that this prior process has not been utilized industrially.

The techniques of performing chemical deposition of tungsten or molybdenum are represented in general by the following two, one of which is to thermally decompose a halide of such metal and the other is to reduce the halide of such metal with hydrogen. Both of these prior processes are conducted, usually, at a temperature of 500° C. or over. Under 500° C., it is extremely difficult to form a pure metal film by deposition technique.

With either of these two prior methods, there invariably takes place a reaction in the interface during the deposition process when the aforesaid metal film is deposited on a semiconductor substrate heated at a temperature higher than 500° C., for example, 700° C. or more, resulting in the formation of a compound, for example, a silicide such as $WSi_2$ or $MoSi_2$ or a germanide such as $WGe_2$ or $MoGe_2$ (in the interface. As a result, none of these processes leads to the formation of an ideal Schottky barrier, but rather, the metal and the semiconductor substrate are connected in ohmic contact. In the event that said metals are deposited on substrates held at a temperature ranging from 500° C. to 700° C., a rectifying barrier can be formed. This however, does not constitute an ideal Schottky barrier. In order to obtain a good Schottky barrier between a substrate and the metal, it is necessary to perform the deposition of metal while the semiconductor substrate is held at a temperature of 500° C. or lower than that. This however, interferes with the aforesaid requirement on the temperature which is 500° C. or more for the acquisition of a good deposition effect. On the other hand, in case the deposition is conducted when the semiconductor substrate is placed at a temperature of 500° C. or lower, there is encountered a difficulty in obtaining a sound development of the reaction of:

$$MoCl_5 + \frac{5}{2}H_2 \longrightarrow Mo + 5HCl$$

a reaction which is desirous in the deposition of, for example, molybdenum. The deposit obtained from the reaction condition, which means a temperature of 500° C. or lower, is a mixture consisting of molybdenum and lower halides thereof. This mixture is a soft, film-like deposit which is hygroscopic and is of a color ranging from yellow to purple, and is of a property which is completely different from that of a pure molybdenum film. Said soft mixed metal deposit is unstable by nature and, therefore, the composite body consisting of this deposit and the semiconductor is far from being usable for practical purposes.

As a result of the extensive research conducted by the inventors in an effort to find a method which would permit the deposition of metal on a semiconductor substrate at 500° C. or lower, there has been developed a method for manufacturing diodes having an excellent Schottky barrier. The method of the present invention is characterized by comprising a first step of depositing a mixture of metal selected from molybdenum or tungsten and its lower halide on a semiconductor substrate consisting of germanium, silicon or gallium arsenide by blowing a mixed gas consisting of the vapor of a halide of said metal and hydrogen onto the substrate while maintaining said substrate at 500° C. or lower, and a subsequent second step represented by subjecting the resulting composite body to treatment by hydrogen at a temperature ranging from 550° C. to 700° C. to completely reduce the deposit to metal, to thereby form a Schottky barrier at the interface between the metal and the substrate. According to the experiments conducted by the inventors, it has been confirmed that even though the deposit is not completely reduced to metal at 500° C. or lower in the first step, it is not only possible to obtain a pure metal film by the treatment in the second step which is conducted in hydrogen current at a high temperature ranging from 550° C. to 700° C., but also the formed Schottky barrier is an ideal one as will be described later. Accordingly, the contact which is formed according to the method of the present invention not only can be utilized in the manufacture of microwave diodes, high speed switching diodes, power diodes and thin film diodes, but also they are applicable to the emitters and collectors of metal base transistors, the gates of field effect transistors, radiation detectors or photodiodes. Thus, the products made according to the method of the present invention have a very wide utility. It has been found also that in the event that the temperature in said subsequent high temperature treatment exceeds 700° C., it was impossible to form an ideal Schottky barrier at the contact area of metal and semiconductor.

Description will now be made in detail on an embodiment of the present invention.

First, onto the powder of molybdenum pentachloride held at 120° C. is passed hydrogen current at the rate of 1.5 liters per minute to form a mixture gas of molybdenum pentachloride and hydrogen gas. This mixed gas is then applied onto the surface of a silicon substrate held at a temperature ranging from 400° C. to 450° C., so as to cause molybdenum to be deposited chemically from the gaseous phase by virtue of the reaction of:

$$MoCl_5 + \frac{5}{2}H_2 \longrightarrow Mo + 6HCl$$

During this process, it is not possible to avoid the deposition of insufficiently reduced lower halides $MoCl_n$ ($n$=2–4). As a result, the deposit formed on the silicon substrate is an unstable film having a color ranging from yellow to purple. However, by placing the silicon substrate, after the deposit having a thickness of 0.3 to 0.5$\mu$ is obtained under the foregoing conditions, in a hydrogen furnace together with the deposit produced on the surface of the substrate, said deposit is completely reduced to a pure molybdenum film having a metallic luster of molybdenum and having an improved adherency to the silicon substrate. By examining this obtained molybdenum film by means of an X-ray microanalyzer and also by means of an electron microscope, it was found that the film consisted of a polycrystal film, with the crystallite having a mean diameter of 1000 A. Subsequently, said molybdenum film of said silicon substrate was plated with copper to form a lead electrode. Thereafter, those portions other than the required area of contact were removed by photoresist-etching technique. On the other hand, an alloy contact of gold containing 1% of antimony was applied at 400° C. to the reverse side of the silicon substrate to form an ohmic electrode, to thereby produce a diode. Measurement was taken of a diode formed by using a silicon substrate consisting of an n-type crystal having a specific resistance of 0.02Ω cm. and having the formation of an epitaxial layer with a thickness of 4$\mu$ with respect to its forward voltage-current characteristic. It was found that the linear gradient indicating said characteristic was quite close to the theoretical value of Schottky barrier, and the ratio of the actual value to the theoretical value was 1.05. From this fact it can be said that this product obtained according to the method of the present invention had an excellent Schottky barrier. It was also noted that the reverse breakdown voltage of this diode was in the range of from 20 to 40 v., and that the barrier height of the Schottky barrier was 0.57 electron volt. In the instant embodiment, a good diode characteristic was obtained by using a temperature range of from 400° C. to 500° C. for the deposition on the silicon substrate in the first step and by using the temperature range of from 550° C. to 700° C. for the after-treatment in the hydrogen furnace in the second step. It is an outstanding feature of the present invention to obtain an excellent Schottky barrier by dividing the metal formation process into the foregoing two steps.

Description has been directed to an instance where a silicon crystal plate is used as the semiconductor substrate. The inventors have succeeded in manufacturing diodes having a satisfactory Schottky barrier on other semiconductor substrates, namely, germanium crystal or gallium arsenide crystal by resorting to the same technique as that used in the formation of the molybdenum film. The Schottky barriers of these experiments showed the barrier height of 0.43 electron volt on the germanium substrate, and 0.63 electron volt on the gallium arsenide substrate.

Description has been made on the chemical deposition of molybdenum. In the case of chemical deposition of tungsten, a result substantially the same as that on the previously described molybdenum was obtained from the reaction of:

$$WCl_6 + 3H_2 \rightarrow W + 6HCl$$

Specifically, onto tungsten hexachloride powder held at 150° C. was applied hydrogen current at the rate of 2 liters per minute to form a mixed gas of tungsten hexachloride and hydrogen gas. Then, this mixed gas was introduced onto the face of a semiconductor substrate held at a temperature ranging from 400° C. to 500° C. to deposit a film consisting of a mixture of tungsten and its lower halide. Thereafter, this composite body was given heat treatment in a hydrogen furnace at a temperature ranging from 550° C. to 700° C., and thus a completely reduced metal film was obtained. In exactly the same manner, a diode was built with this composite body, and its Schottky barrier was measured. The height of the Schottky barrier of this product showed a value of 0.65 electron volt on the silicon semiconductor, 0.45 electron volt on the germanium semiconductor, and 0.7 on the gallium arsenide semiconductor. It was made clear that an excellent Schottky barrier was formed in each of these instances.

What is claimed is:

1. A method for manufacturing semiconductor devices comprising a first step of depositing a metal selected from the group consisting of molybdenum and tungsten together with at least one lower halide of said metal on a semiconductor substrate selected from the group consisting of silicon, germanium and gallium arsenide by reducing a halide of said metal with hydrogen while maintaining said semiconductor substrate at a temperature range of from 400° C. to 500° C., and a second step of subjecting the resulting composite body of said substrate and the deposited film to heat treatment in a hydrogen current at a temperature ranging from 550° C. to 700° C., thereby completely reducing said deposited film to a metal film.

References Cited

UNITED STATES PATENTS

| | | | |
|---|---|---|---|
| 1,226,925 | 5/1917 | Throwless | 117—107.2 X |
| 2,475,601 | 7/1949 | Fink | 117—107 |
| 3,349,297 | 10/1967 | Crowell et al. | 317—234 X |
| 3,424,627 | 1/1969 | Michel et al. | 148—174 |

WILLIAM L. JARVIS, Primary Examiner

U.S. Cl. X.R.

117—107.2, 227; 317—235

PO-1050
(5/69)

UNITED STATES PATENT OFFICE
CERTIFICATE OF CORRECTION

Patent No. 3,515,583 Dated June 2, 1970

Inventor(s) Morio INOUE et al

It is certified that error appears in the above-identified patent and that said Letters Patent are hereby corrected as shown below:

Convention Priority is based on The Japanese Application no. 41/20208 instead of 41/10208 as the Patent now reads.

Signed and sealed this 7th day of September 1971.

(SEAL)
Attest:

EDWARD M.FLETCHER,JR.
Attesting Officer

ROBERT GOTTSCHALK
Acting Commissioner of Patents